US012622179B2

(12) United States Patent
You et al.

(10) Patent No.: US 12,622,179 B2
(45) Date of Patent: May 5, 2026

(54) MAGNETIC FIELD-FREE SPIN-ORBIT TORQUE SWITCHING DEVICE USING SAPPHIRE MISCUT SUBSTRATE

(71) Applicant: DAEGU GYEONGBUK INSTITUTE OF SCIENCE AND TECHNOLOGY, Daegu (KR)

(72) Inventors: Chun Yeol You, Seoul (KR); Jin A Kim, Hwaseong-si (KR); Su Hyeok An, Daegu (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 578 days.

(21) Appl. No.: 17/969,146

(22) Filed: Oct. 19, 2022

(65) Prior Publication Data

US 2023/0165163 A1 May 25, 2023

(30) Foreign Application Priority Data

Nov. 25, 2021 (KR) ........................ 10-2021-0164468

(51) Int. Cl.
*H10N 52/80* (2023.01)
*H10N 52/00* (2023.01)

(52) U.S. Cl.
CPC ............. *H10N 52/80* (2023.02); *H10N 52/00* (2023.02)

(58) Field of Classification Search
None
See application file for complete search history.

(56) References Cited

U.S. PATENT DOCUMENTS

| | | | |
|---|---|---|---|
| 5,783,284 A * | 7/1998 | Shinjo | H01F 10/324 |
| | | | 428/167 |
| 6,104,189 A * | 8/2000 | Allenspach | B82Y 10/00 |
| | | | 324/252 |
| 2019/0006581 A1* | 1/2019 | Eom | H10N 52/01 |
| 2022/0130887 A1* | 4/2022 | Yu | H10F 77/124 |

FOREIGN PATENT DOCUMENTS

| | | |
|---|---|---|
| KR | 10-2011-0093007 A | 8/2011 |
| KR | 10-1521383 B1 | 5/2015 |
| KR | 10-2018-0057384 A | 5/2018 |
| KR | 10-2018-0108025 A | 10/2018 |
| KR | 10-2019-0044441 A | 4/2019 |
| KR | 10-2249655 B1 | 5/2021 |
| KR | 10-2021-0080575 A | 6/2021 |

OTHER PUBLICATIONS

Korean Intellectual Property Office issued Decision To Grant Patent No. 10-2021-0111461 dated Jul. 28, 2023.

* cited by examiner

*Primary Examiner* — Nilufa Rahim
(74) *Attorney, Agent, or Firm* — Sughrue Mion, PLLC

(57) ABSTRACT

Disclosed is a magnetic field-free spin-orbit torque switching device including a sapphire miscut substrate. More particularly, a spin-orbit torque switching device according to an embodiment includes a substrate having a step-terrace structure; and an input device formed on the substrate and provided with a heavy metal layer HM and a ferromagnetic layer FM.

1 Claim, 9 Drawing Sheets

【FIG. 1】
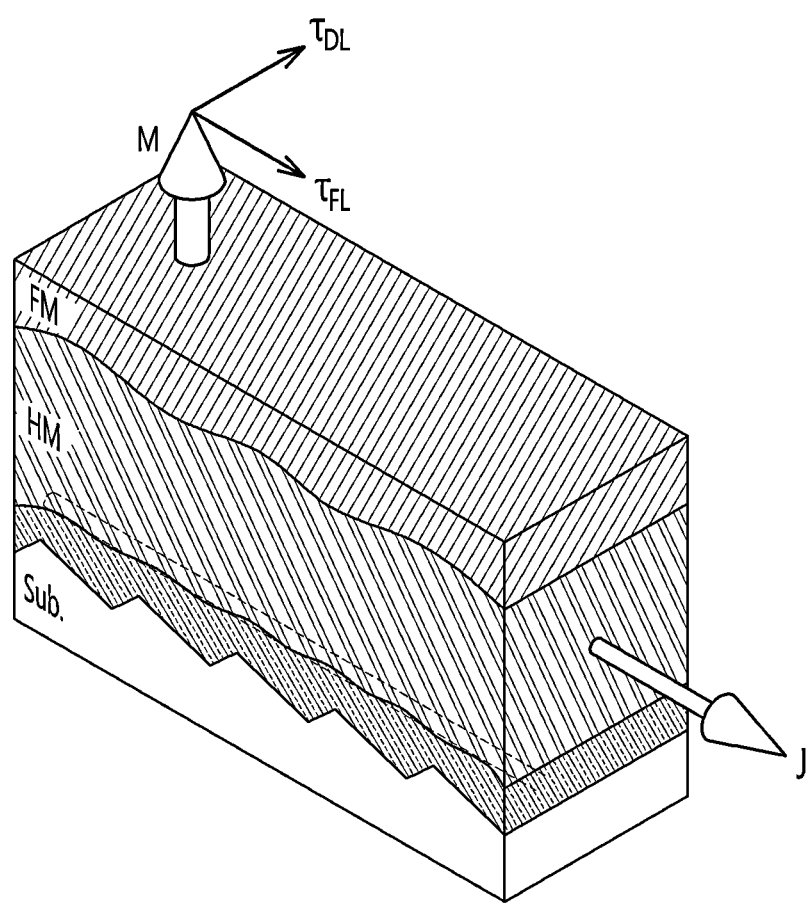

【FIG. 2】
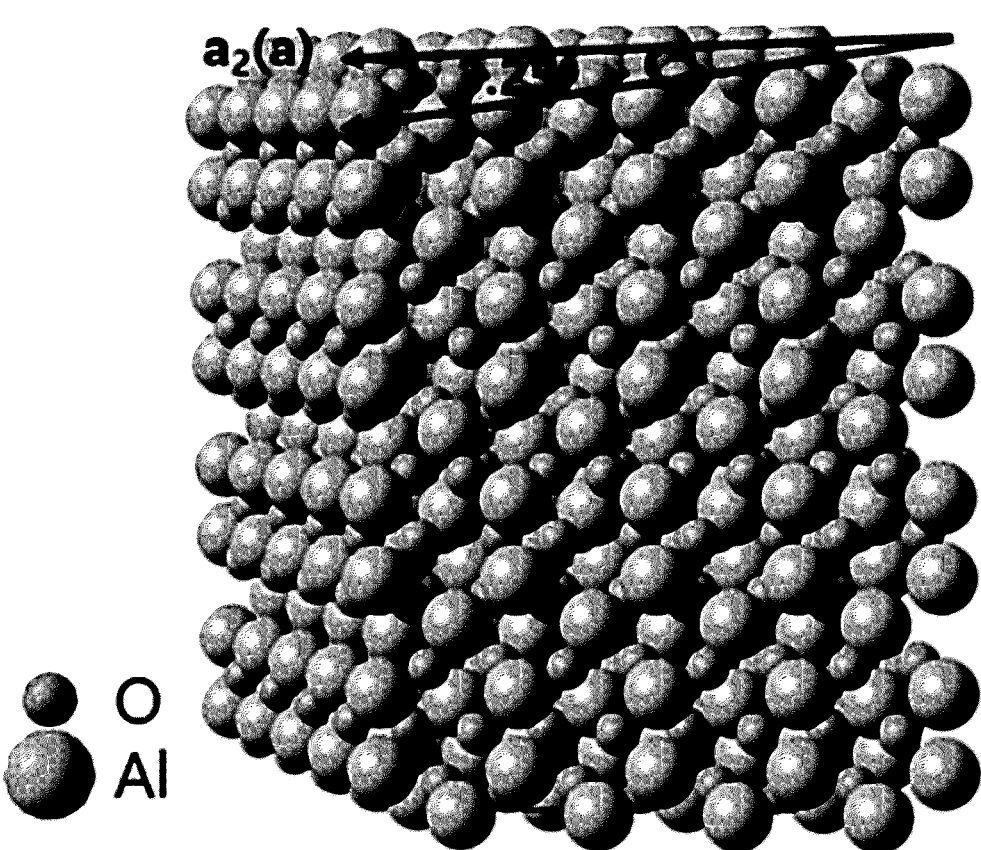

【FIG. 3】
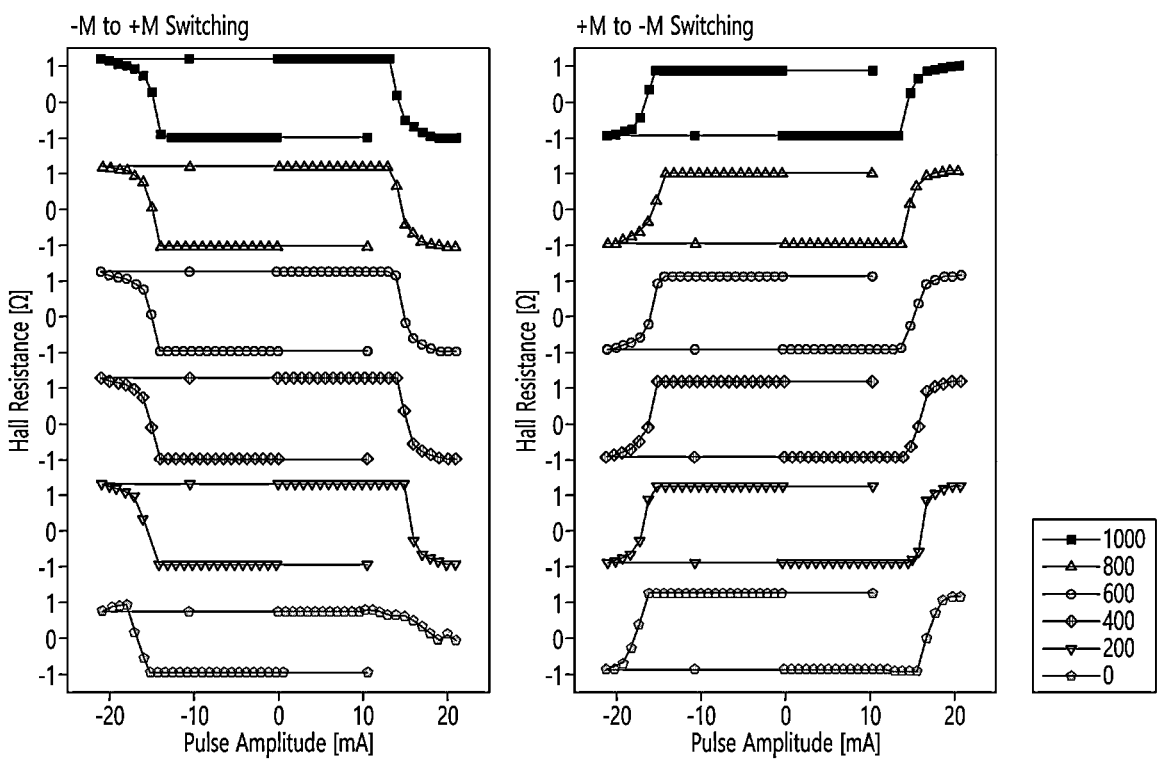

【FIG. 4】
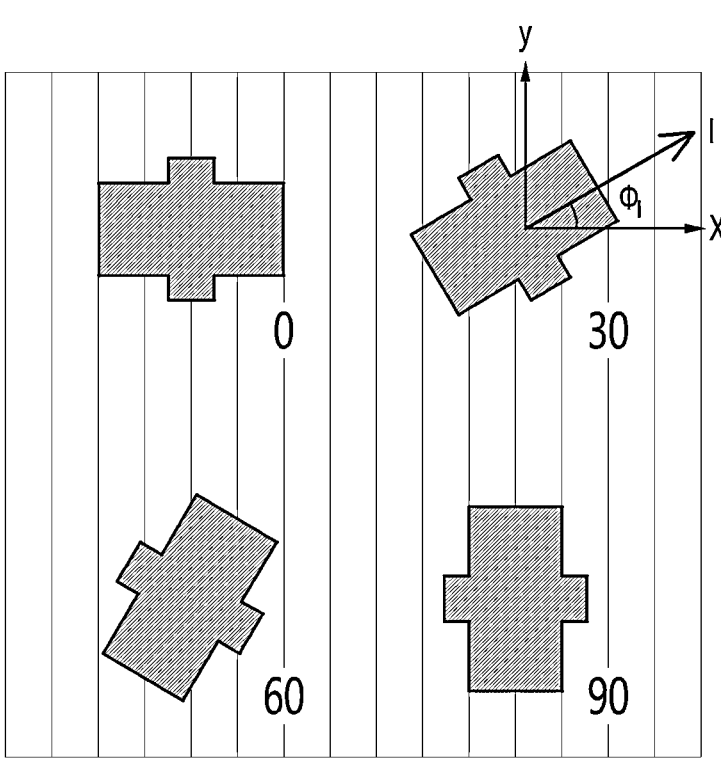

【FIG. 5】
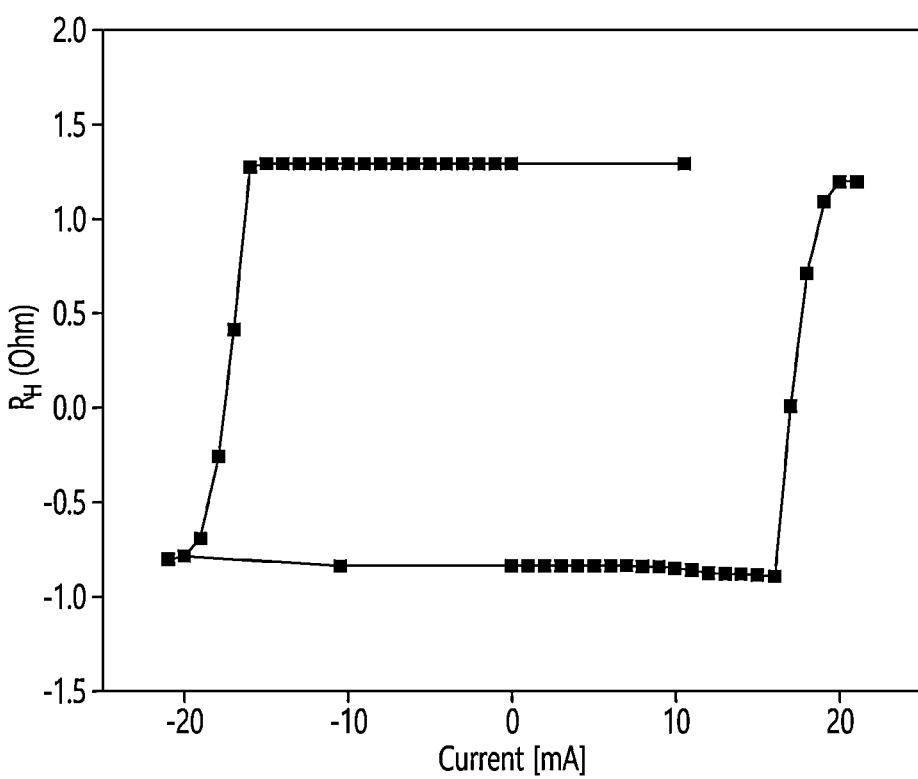

【FIG. 6】
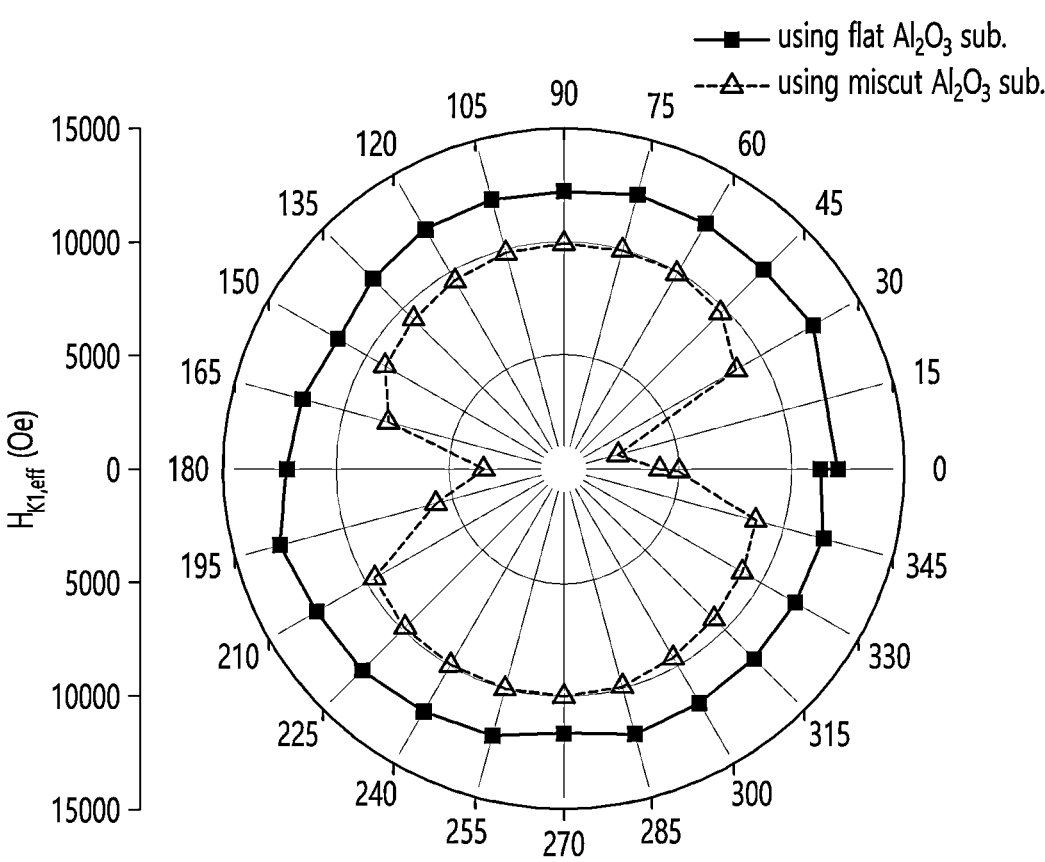

【FIG. 7】
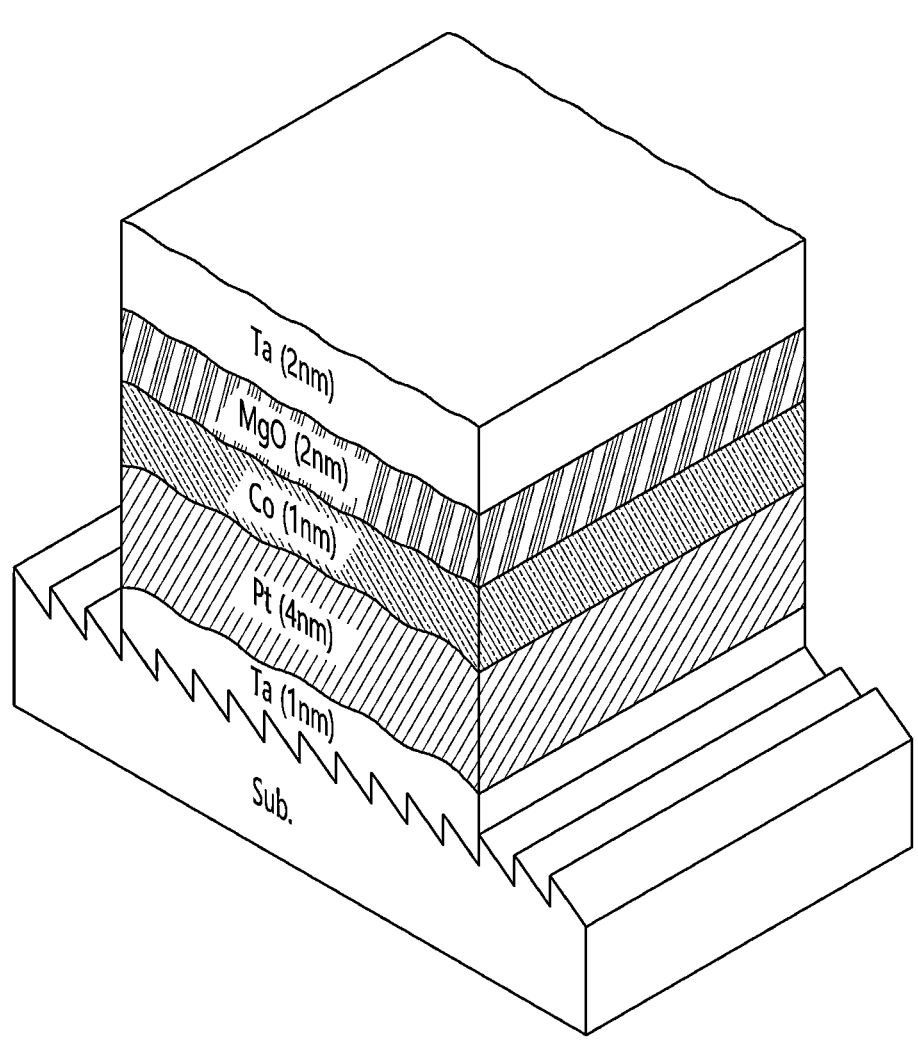

[FIG. 8-1]

| | | |
|---|---|---|
| A. van den Brink et al. | In-plane symmetry breaking effect due to exchange interaction effect between magnetic and diamagnetic materials | |
| | 2016 | |
| Shunsuke Fukami et al. | In-plane symmetry breaking effect due to exchange interaction effect between magnetic and diamagnetic materials (Using diamagnetic metal instead of heavy metal as input stage for magnetization reversal) | |
| | 2016 | |
| Young-Wan Oh et al. | Breaking of magnetization direction symmetry of information transfer layer through ferromagnetic intercalation layer with in-plane magnetic anisotropy | |
| | 2019 | |
| | 2021 | |

[FIG. 8-2]

| | | |
|---|---|---|
| Zhaochu Luo et al. | Formation of asymmetric exchange interaction due to in-plane anisotropic symmetry breaking | |
| | 2019 | |
| Baoshan Cui et al. | In-plane Rashba symmetry break effect with wedge sample | |
| | 2019 | |
| Min-Gu Kang et al. | Inner layer local Rashba symmetry breaking effect through partial electric field manipulation inside device | |
| | 2020 | |
| Liang Liu et al. | Symmetry breaking effect due to crystal structure | |
| | 2021 | |

MAGNETIC FIELD-FREE SPIN-ORBIT TORQUE SWITCHING DEVICE USING SAPPHIRE MISCUT SUBSTRATE

CROSS-REFERENCE TO RELATED APPLICATION

This application claims priority to Korean Patent Application No. 10-2021-0164468, filed on Nov. 25, 2021 in the Korean Intellectual Property Office, the disclosure of which is incorporated herein by reference.

BACKGROUND OF THE DISCLOSURE

Field of the Disclosure

The present disclosure relates to a spin-orbit torque switching device, and more particularly to a technical idea of implementing magnetic field-free switching using a sapphire miscut substrate.

Description of the Related Art

Recently, research on magnetic memory devices based on spin-orbit torque (SOT) has been actively conducted. A write process of a SOT-based magnetic memory device utilizes a heavy metal (HM)/ferromagnetic (FM) bilayer without an additional ferromagnetic layer required for a spin transfer torque memory device.

Compared to an existing spin-transfer-torque (STT)-based magnetic memory device, the SOT-based magnetic memory device has higher switching efficiency compared to the same current, but requires the application of an in-plane magnetic field.

Accordingly, since the need for an in-plane magnetic field at an input terminal for inputting information in device integration was considered to be a matter to be corrected, various studies on the absence of an in-plane magnetic field are being conducted as shown in FIG. 8-1 and FIG. 8-2.

RELATED ART DOCUMENTS

Patent Documents

Korean Patent Application Publication No. 10-2021-0080575, "METHODS FOR FORMING STRUCTURES FOR MRAM APPLICATIONS"

Korean Patent Application Publication No. 10-2011-0093007, "Method of forming surface pattern of sapphire, method of nitride semiconductor light emitting device, and nitride semiconductor light emitting device"

SUMMARY OF THE DISCLOSURE

Therefore, the present disclosure has been made in view of the above problems, and it is one object of the present disclosure to provide a spin-orbit torque switching device capable of implementing non-magnetic field switching by inducing symmetry breaking by changing the shape of a substrate, unlike a magnetic field-free spin-orbit torque-based information input device of an existing technology.

It is another object of the present disclosure to provide a spin-orbit torque switching device that can be easily manufactured and is compatible with device measurement by inducing a symmetrical breaking effect by only replacing a substrate in an existing device with a miscut substrate.

In accordance with an aspect of the present disclosure, the above and other objects can be accomplished by the provision of a spin-orbit torque switching device, including: a substrate having a step-terrace structure; and an input device formed on the substrate and provided with a heavy metal layer HM and a ferromagnetic layer FM.

According to an aspect, the substrate may be miscut by 0.5° to 10° in an a-axis direction from the C-plane direction.

According to an aspect, the substrate may be miscut by 0.5° to 10°, thereby implementing magnetic field-free spin-orbit torque switching by inducing in-plane symmetry breaking.

According to an aspect, the substrate may be a sapphire ($Al_2O_3$) substrate having a step-terrace structure.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a spin-orbit torque switching device according to an embodiment;

FIG. 2 illustrates a cross-sectional conceptual view of a substrate according to an embodiment;

FIG. 3 illustrates magnetic field strength-dependent magnetization reversal results of a spin-orbit torque switching device according to an embodiment;

FIG. 4 illustrates a device characteristic using a sample deposited on a miscut sapphire substrate;

FIG. 5 illustrates a magnetic field-free switching characteristic by SOT at $\phi_f = 60°$;

FIG. 6 illustrates an effective anisotropy field characteristic calculated by a generalized sucksmith-thompson (GST) method as a function of $\phi_f$; and FIG. 7 illustrates an embodiment of a spin-orbit torque switching device according to an embodiment.

FIG. 8-1 shows various studies on the absence of an in-plane magnetic field are being conducted.

FIG. 8-2 shows various studies on the absence of an in-plane magnetic field are being conducted.

DETAILED DESCRIPTION OF THE DISCLOSURE

The embodiments will be described in detail herein with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, the expression "processor configured to perform A, B, and C" may mean that a general-purpose processor (e.g., CPU or application processor) performs the corresponding operations by executing a dedicated processor (e.g., an embedded processor) or one or more software programs stored in the memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the disclosure are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

FIG. 1 illustrates a spin-orbit torque switching device according to an embodiment, and FIG. 2 illustrates a cross-sectional conceptual view of a substrate according to an embodiment.

Referring to FIGS. 1 to 2, the spin-orbit torque switching device according to an embodiment may include a substrate Sub having a step-terrace structure; and an input device formed on the substrate Sub and provided with a heavy metal layer HM and a ferromagnetic layer FM.

According to an aspect, the substrate Sub may be a sapphire ($Al_2O_3$) substrate miscut by 0.5° to 10° in an a-axis direction from a C-plane direction. Here, the substrate Sub is miscut by 0.5° to 10°, thereby implementing magnetic field-free spin-orbit torque switching by inducing in-plane symmetry breaking.

In other words, the spin-orbit torque switching device according to an embodiment includes a heavy metal input terminal for inputting information and a ferromagnetic layer for storing information and is made of a miscut substrate including the same heavy metal/ferromagnetic layer as in a conventional device using spin-orbit torque switching, but having a step-terrace structure as a sapphire ($Al_2O_3$) substrate miscut by 0.5° to 10° in the a-axis direction from the C-plane for magnetic field-free switching, so that, when a current injected into a heavy metal layer is converted to a spin current by the spin Hall effect, an additional internal help can be generated to implement magnetic field-free switching.

According to an aspect, the size of the terrace of the substrate Sub having the step-terrace structure may be changed according to the angle of the substrate, and the result of non-magnetic field switching may be determined according to the changing size of the terrace.

FIG. 3 illustrates magnetic field strength-dependent magnetization reversal results of a spin-orbit torque switching device according to an embodiment.

Referring to FIG. 3, it can be confirmed that the spin-orbit torque switching device according to an embodiment has a magnetization reversal characteristic based on spin-orbit torque according to external magnetic field strength.

FIG. 4 illustrates a device characteristic using a sample deposited on a miscut sapphire substrate, FIG. 5 illustrates a magnetic field-free switching characteristic by SOT at $\phi_I=60°$, and FIG. 6 illustrates an effective anisotropy field characteristic calculated by a generalized sucksmith-thompson (GST) method as a function of $\phi_I$.

Referring to FIGS. 4 to 6, it can be confirmed that as a result of measuring the spin-orbit torque conversion of magnetization by changing an angle between a miscut direction (x-axis) and a current injection direction ($\phi_I$), the spin-orbit torque switching device according to an embodiment implements magnetic field-free switching due to symmetry breaking induced by applying a miscut substrate.

Specifically, it can be confirmed that as a result of comparing the spin-orbit torque switching device according to an embodiment, to which the miscut sapphire substrate is introduced, and a spin-orbit torque switching device to which a flat (none-miscut) sapphire substrate is introduced, the spin-orbit torque switching device according to an embodiment exhibits a uniaxial anisotropy characteristic, whereas an existing spin-orbit torque switching device does not exhibit the characteristic (FIG. 6).

That is, in the case of the spin-orbit torque switching device according to an embodiment, in-plane symmetry breaking may be induced by introducing a miscut sapphire substrate, thereby implementing magnetic field-free spin-orbit torque switching.

FIG. 7 illustrates an embodiment of a spin-orbit torque switching device according to an embodiment.

Referring to FIG. 7, in the spin-orbit torque switching device according to an embodiment, an input device may be deposited on a sapphire substrate Sub miscut by 0.5° to 10° in the a-axis direction from the C-plane direction using magnetron sputtering. Here, the input device may be implemented in a 1 multilayer structure of Ta(1 nm)/Pt(4 nm)/Co(1 nm)/MgO(2 nm)/Ta(2 nm).

Specifically, a Ta layer directly on the substrate serves as a buffer layer, and the uppermost Ta layer serves as a protective layer, and a portion operating as a device may be a Pt/Co/MgO layer.

The input device may form a pattern of the device for measurement through argon ion milling etching after deposition, and the size of the formed pattern may be a single hole bar pattern having a width of 5 μm and a length of 20

5                                                                          6

μm. After pattern formation, an electrode may be deposited using Cu for magnetron sputtering as in device deposition.

According to an embodiment, the present disclosure can implement non-magnetic field switching by inducing symmetry breaking by changing the shape of a substrate, unlike a magnetic field-free spin-orbit torque-based information input device of an existing technology.

According to one embodiment, the present disclosure can induce a symmetrical breaking effect by only replacing a substrate in an existing device with a miscut substrate, thereby providing a spin-orbit torque switching device that can be easily manufactured and is compatible with device measurement.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A spin-orbit torque switching device, comprising:

a miscut substrate having a step-terrace structure; and an input device formed on the miscut substrate and provided with a heavy metal layer HM and a ferromagnetic layer FM, wherein the miscut substrate is a sapphire ($Al_2O_3$) substrate, wherein the input device is patterned through etching after depositing a heavy metal layer and a ferromagnetic layer on the miscut substrate, and has the heavy metal layer HM disposed on the miscut substrate and the ferromagnetic layer FM disposed on the heavy metal layer HM, wherein the miscut substrate is miscut by 0.5° to 10° in an a-axis direction from the C-plane direction, and generates additional internal assistance when the current injected into the heavy metal layer is converted into spin current by the spin hall effect based on the miscut by 0.5° to 10°, and wherein the additional internal assistance implements a magnetic field-free spin-orbit torque switching by inducing in-plane symmetry breaking.

* * * * *